United States Patent

Urbaniak et al.

[11] Patent Number: 5,875,214
[45] Date of Patent: Feb. 23, 1999

[54] DEVICE FOR INITIALIZING A VITERBI DECODER IN A RECEIVER FOR SIGNALS TRANSMITTED IN THE FORM OF BURSTS, CORRESPONDING RECEIVER AND CORRESPONDING INITIALIZATION METHOD

[75] Inventors: Oliver Urbaniak, Eragny Sur Oise; André Bazet, Clichy, both of France

[73] Assignee: Alcatel Telspace, Cedex, France

[21] Appl. No.: 602,344

[22] Filed: Feb. 16, 1996

[30] Foreign Application Priority Data

Feb. 17, 1995 [FR] France .................................. 95 01863

[51] Int. Cl.[6] ..................................................... H03D 1/00
[52] U.S. Cl. .......................... 375/341; 375/356; 375/354; 371/44; 371/45; 371/46; 371/2.1; 371/30; 371/37.1; 371/38.1
[58] Field of Search ..................................... 375/341, 356, 375/354; 371/44, 45, 46, 43.7, 39.1, 43, 38.1

[56] References Cited

U.S. PATENT DOCUMENTS

| | | |
|---|---|---|
| 4,583,078 | 4/1986 | Shenoy et al. . |
| 5,029,186 | 7/1991 | Maseng et al. ............................. 375/99 |
| 5,260,976 | 11/1993 | Dolivo et al. .............................. 375/94 |
| 5,384,782 | 1/1995 | Elms ........................................ 371/2.1 |
| 5,610,983 | 3/1997 | Stewart ..................................... 380/15 |

FOREIGN PATENT DOCUMENTS

| | | |
|---|---|---|
| WO8908884 | 9/1989 | WIPO . |
| WO9206429 | 4/1992 | WIPO . |
| WO9415427 | 7/1994 | WIPO . |

OTHER PUBLICATIONS

R. L. Moat, "ACTS Baseband Processing", Globecom '86, IEEE Global Telecommunications Conference, Communications Broadening Technology Horizons, Conference Record (Cat. No. 86CH2298–9) Houston, TX, Dec. 1–4, 1986, New York, NY, IEEE pp. 578–583.

Clarke, K.C. et al, "Multi–channel Viterbi Decoder LSI Development", Milcom 86, 1986, 1986 IEEE Military Communications Conference. Communications–Computers: Teamed for the 90'2. Conference Record (Cat. No. 86CH2323–4), Monterey, CA, USA 5–9 Oct. 1986, New York, NY US, IEEE, pp. 12.6/1–5.

Otanis S. et al, "Development of a Variable Rate FEC LSI for Satellite Communications", NEC Research and Development, Jan. 1988, Japan, No. 88, Jan. '88, ISSN 0547–051X, pp. 12–19.

Primary Examiner—Stephen Chin
Assistant Examiner—Tuan Le A.
Attorney, Agent, or Firm—Sughrue, Mion, Zinn, Macpeak & Seas, PLLC

[57] ABSTRACT

A device for initializing a Viterbi decoder in a receiver for signals transmitted in the form of bursts, each burst comprising a synchronization word and message data that has undergone convolutional coding in a transmitter, the position of the message data relative to the synchronization word being known, includes a detector for detecting the synchronization word, a multiplexer for applying the received signals to the Viterbi decoder in the presence of the message data and for applying to the Viterbi decoder, immediately before and immediately after the message data, a code sequence generated locally, free of errors and having a length at least equal to the truncation length of the Viterbi decoder.

12 Claims, 1 Drawing Sheet

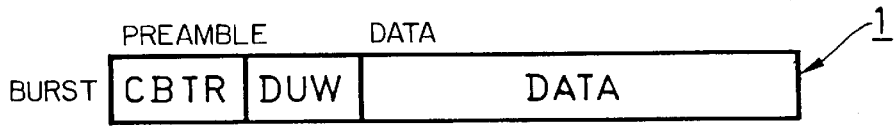
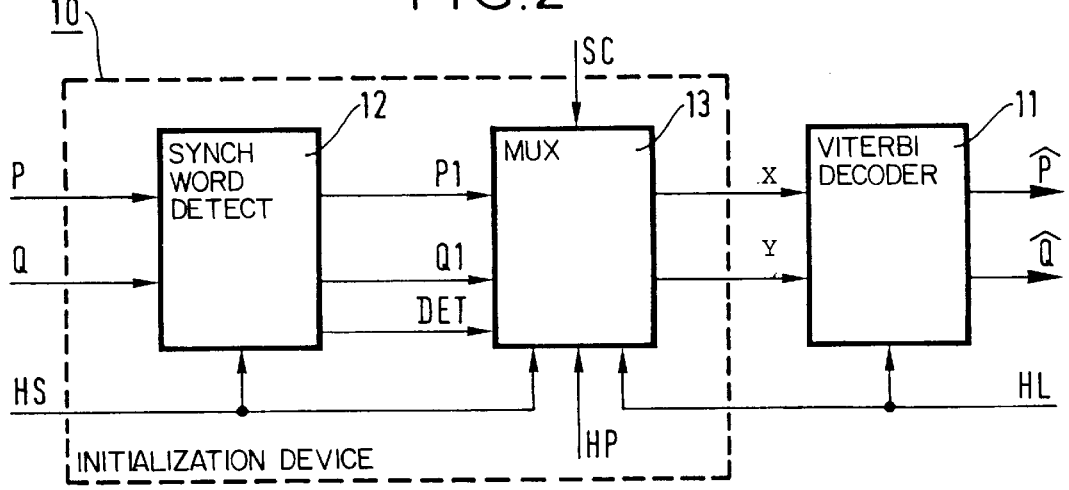
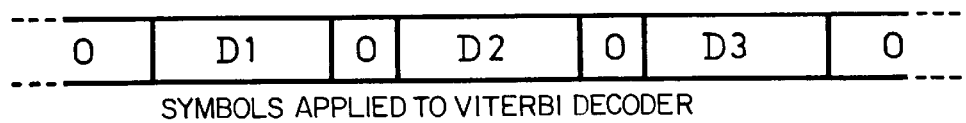
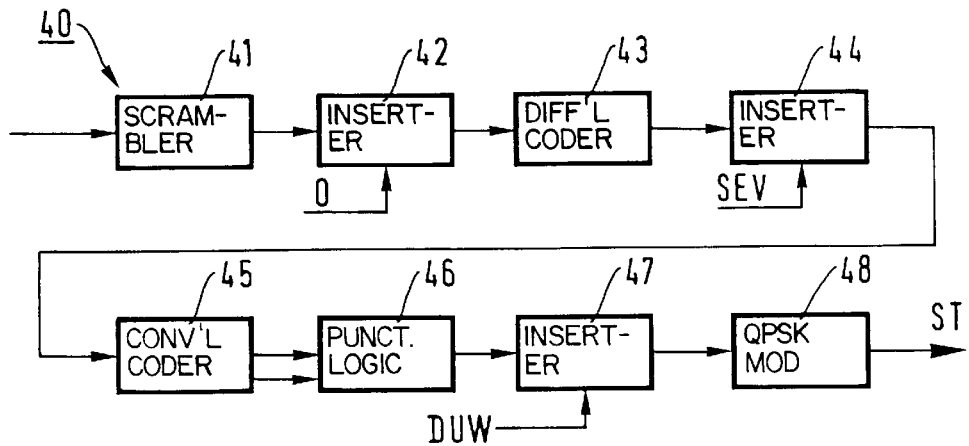

DEVICE FOR INITIALIZING A VITERBI DECODER IN A RECEIVER FOR SIGNALS TRANSMITTED IN THE FORM OF BURSTS, CORRESPONDING RECEIVER AND CORRESPONDING INITIALIZATION METHOD

BACKGROUND OF THE INVENTION

1. Field of the Invention

The field of the invention is that of digital telecommunications, in particular via satellite, and in particular that of digital signal receivers for receiving convolutionally coded signals.

To be more precise, the present invention concerns a device for initializing a Viterbi decoder in a demodulator stage of a receiver for signals transmitted in the form of bursts (TDMA transmission), a receiver comprising an initialization device of this kind and a method used for this initialization.

2. Description of the Prior Art

In the prior art, digital data to be transmitted can be convolutionally coded in the transmitter in order to reduce the error rate on radio transmission between the transmitter and a receiver, for example via a satellite. The convoluted data is decoded in the receiver by a Viterbi decoder. In the remainder of this description, the expression "Viterbi decoder" refers to any decoder using the criterion of maximum likelihood. The decoding is carried out after the received signal is transposed into the baseband and a decision on the symbols is not generally taken until after decoding (this is known as "soft decision").

The use of coding and decoding of this kind for continuous links is known in itself. Reference may be had, for example, to French patent application No. 2 530 096 in the joint names of NEC CORPORATION and KOKUSAI DENSHIN DENWA CO, LTD. concerning a synchronization circuit for a Viterbi decoder using a signal resulting from the difference between the maximum and minimum metrics to obtain synchronization (the mean difference between the maximum and minimum metrics has a high value when synchronization is obtained).

The drawback of this device is that a large number of errors occurs at call set-up time because when the first data is received the Viterbi decoder is not immediately ready to decode it. For this reason a large number of errors is tolerated at call set-up time. This is not a particular problem in the case of continuous transmission, but is unthinkable in the case of TDMA transmission.

In TDMA transmission each burst transmitted comprises a synchronization word, also called the unique word, and message data, the number of message data words and their position relative to the synchronization word being known.

FIG. 1 shows the structure of a transmitted data burst in the case of TDMA transmission.

The burst 1 includes a preamble in the fields CBTR and DUW and message data in the field DATA. The field CBTR includes bits enabling carrier and bit timing recovery. The field DUW includes the symbols of the synchronization word and the field DATA includes the message data bits.

In this burst the synchronization word DUW is in the preamble and its last bit is immediately followed by the first message data bit.

If convolutional coding is to be applied to the message data, the Viterbi decoder in a receiver that receives this burst must be ready to decode message data as soon as its synchronization word is detected, to prevent a burst of errors being produced when the first message data is received. The solution mentioned above (synchronizing the Viterbi decoder by monitoring the divergence of the maximum and minimum metrics) takes too long and cannot be used for TDMA transmission.

The article by Richard L. Moat entitled "ACTS BASEBAND PROCESSING", Globecom '86, IEEE Global Telecommunications Conference, Communications Broadening Technology Horizons, Conference Record CH2298-9, Houston, vol. 1, pages 578–583 describes the provision of a sequence for flushing data written in a Viterbi decoder. This sequence is made up of the first code words received of a sequence, stored in RAM and already decoded.

The drawback of this technique is that it does not prepare the decoder to receive code words and, most importantly, the words received are not necessarily code words since transmission errors may have occurred. In this case the Viterbi decoder can diverge and the last words of the block decoded do not correspond to those of the source.

An object of the present invention is to remedy these drawbacks.

To be more precise, an object of the invention is to provide a device for initializing a Viterbi decoder in a receiver for signals transmitted in the form of bursts, the bursts received possibly coming from different transmitters and being irregularly spaced in time due to the existence of a guard time between the received bursts. The initialization of the decoder must ensure correct decoding of all message data.

SUMMARY OF THE INVENTION

In accordance with the invention, this object is achieved by a device for initializing a Viterbi decoder in a receiver for signals transmitted in the form of bursts, each burst comprising a synchronization word and message data that has undergone convolutional coding in a transmitter, the position of the message data relative to the synchronization word being known, the device comprising:

means for detecting the synchronization word, multiplexing means for applying the received signals to the Viterbi decoder in the presence of the message data and for applying to the Viterbi decoder, immediately before and immediately after the message data, a code sequence generated locally, free of errors and having a length at least equal to the truncation length of the Viterbi decoder.

The invention also concerns a receiver comprising an initialization device of this kind and a method of initializing a Viterbi decoder.

The present invention will be better understood on reading the following description of one preferred embodiment given by way of non-limiting illustrative example and from the appended drawings.

BRIEF DESCRIPTION OF THE DRAWINGS

FIG. 1 shows the structure of a data burst in a TDMA transmission.

FIG. 2 is a block diagram of a preferred embodiment of an initialization device of the invention.

FIG. 3 shows a continuous stream of symbols supplied to the Viterbi decoder from FIG. 2.

FIG. 4 is a block diagram of a preferred embodiment of a TDMA signal transmitter adapted to communicate with a receiver comprising an initialization device as shown in FIG. 2.

DETAILED DESCRIPTION OF THE PREFERRED EMBODIMENTS

FIG. 1 has already been described with reference to the prior art.

FIG. 2 is a block diagram of a preferred embodiment of an initialization device of the invention. This initialization device 10 cooperates with a Viterbi decoder 11 in a receiver for signals transmitted in the form of bursts. Each burst conventionally comprises a synchronization word and message data, the positions of the message data words relative to the synchronization word being known. The various bursts received by the receiver have a structure identical to that shown in FIG. 1, for example. In accordance with the invention, the data is convolutionally coded in the transmitter. As a result, the DATA field contains symbols that have been convolutionally coded.

The initialization device shown in FIG. 2 receives at its input two digital bit streams P and Q from a demodulator (not shown) on its input side. It includes means 12 for detecting the synchronization word in each received burst. These detection means comprise an energy detector followed by a correlator supplying a signal DET when the synchronization word is recognized, for example. Reference may be had to U.S. patent application Ser. No. 266,458 filed 27th Jun. 1994, for example. The signal DET comprises a pulse having the same duration as a symbol marking the presence of the first message data symbol, for example. The detector means can also resolve ambiguity as to the phase of the bit streams P and Q and supply at the output bit streams P1 and Q1 corresponding to the bit streams P and Q with this ambiguity resolved. The bit streams P1 and Q1 (or the bit streams P and Q if there is no provision for resolving ambiguity) and the detection signal DET are fed to multiplexing means 13 which supply to the Viterbi decoder 11 the signals received, in the presence of message data, and which apply to the Viterbi decoder 11, immediately before and immediately after the message data, a code sequence SC generated locally, free of errors and whose length is at least equal to the truncation length of the Viterbi decoder 11. If X and Y are the signals applied to the decoder 11, X and Y are respectively equal to P1 and Q1 (P and Q) in the presence of message data and correspond to the code sequence SC on either side of these coded sequences, over at least the truncation length of the decoder 11. The truncation length of the decoder 11 is defined as the number N of successive symbols to be supplied to the decoder 11 for the (N+1)th symbol to have no effect on the decoding of the first symbol. This first symbol is then a decided symbol. The greater the truncation length, the better the decoding performance and the lower the error rate.

The truncation length depends on the type of coder used in the transmitter, on the puncture logic employed, if any, and on the required quality of decoding. For example, the truncation length is equal to five times the constraint length of the coder used in the transmitter for a ½ code and ten times the constraint length for a ¾ code.

The code sequence SC corresponds to a sequence that it must be possible for the convolutional coder used in the transmitter to produce. Applying this sequence to the decoder 11 before the message data prepares the latter to receive the first message data. When the Viterbi decoder has received this coded sequence, generated locally and therefore free of errors, it has in memory the best decoding path, known as the surviving path. The decoder is therefore initialized by applying this code sequence before the message data. The decoder processes this code sequence as coded data and, when it has processed a quantity of data corresponding to its truncation length, is ready to process the message data. Thus the decoder is prepared to receive the message data.

In an embodiment that is particularly simple to implement and therefore constitutes a preferred embodiment, the code sequence generated locally is made up of identical logic levels, for example a series of logic "0" levels. Any convolutional coder can generate a series of low logic levels. This embodiment entails connecting the inputs of the decoder to ground for the appropriate times, for example.

It will be noted that the invention ensures correct decoding of the last message data words by supplying to the Viterbi decoder, after the last message data symbol, a code sequence at least as long as the truncation length of the Viterbi decoder 11. This ensures correct decoding of the last message data words. To simplify the implementation, this code sequence is preferably the same as that applied to the decoder before the message data.

In a preferred embodiment the code sequence generated locally is supplied continuously to the Viterbi decoder, except when message data is present, with the result that the Viterbi decoder sees only a continuous stream of data to be decoded. This greatly facilitates the implementation of the initialization circuit: in the presence of coded message data, the position of which is detected by virtue of the synchronization word, the coded data is supplied to the Viterbi decoder, whereas in the absence of coded message data, the Viterbi decoder 11 receives the code sequence generated locally.

Thus a first approach might consider the means 13 as multiplexing means applying to the inputs of the decoder 11 either the coded message data, when the latter is present, or the code sequence SC.

FIG. 3 shows a continuous stream of symbols applied to the Viterbi decoder. The message data bursts are denoted Di (D1 through D3 for three consecutive bursts received) and the code sequences are made up of logic "0" levels.

The invention assumes that the position of the message data words relative to the synchronization word and the length of the message data words are known. The invention applies in particular to TDMA transmission in which each burst includes a preamble and the synchronization word is included in each preamble. The synchronization word can precede the message data, the general structure of the frame being in this case as shown in FIG. 1.

The bursts received each advantageously include a postamble to enable the transition between the end of the message data and the code sequence generated locally. This postamble constitutes the end of the message data and is obtained by convolution of the last message data words to be transmitted with a sequence called a flushing sequence, for example a sequence of "0" levels, the length of which is at least equal to k−1 where k is the constraint length of the convolutional coder used in the transmitter. If k=7, for example, a sequence of six logic "0" states is inserted in the transmitter, on the input side of the convolutional coder, in order to flush the last six message data words to be transmitted from the coder. For example, if 100 message data bits are transmitted in a burst, the data field DATA in FIG. 1 contains 212 (106*2) bits for a ½ convolutional coder not followed by any puncture logic.

FIG. 4 is a block diagram of a preferred embodiment of a TDMA signal transmitter adapted to communicate with a receiver including an initialization device as shown in FIG. 2.

The transmitter 40 includes an optional scrambler 41 to which the message data to be transmitted is supplied from a source. The scrambled data is applied to first inserter means 42 which inserts a logic "0" state (depth of the differential coder−1) immediately before the first message data bit. The function of this logic "0" state is explained below.

The output signal of the first inserter means 42 is applied to a differential coder 43 followed by second inserter means 44 which inserts a sequence SEV the length of which is at least equal to k−1 where k is the constraint length of a convolutional coder 45. The output signals of the second inserter means 44 are applied to the convolutional coder 45, which is a ½ coder having a constraint length of 7. Using octal notation, the generator polynomial of the convolutional coder 45 can be G=(171, 133).

The coded symbols from the convolutional coder 45 are applied to optional puncture logic 46 which also serializes the coded symbols, followed by a stage 47 for inserting the synchronization word DUW. The resultant signal is applied to QPSK modulator means 48 producing a signal ST transmitted in the form of bursts.

The differential coder 43, and a corresponding decoder in the receiver, for example after the Viterbi decoder, are needed for TDMA transmission of convoluted data to protect against phase jumps that can affect the transmission of the current burst. The function of the first inserter means 42 is to initialize the differential decoder, in this instance in two dimensions.

The equations of a two-dimensional differential coder are as follows, for example:

$$P_i=(\overline{A_i \cdot B_i} \cdot P_{i-1})+(A_i \cdot \overline{B_i} \cdot \text{fheight} \overline{Q_{i-1}})+(A_i \cdot B_i \cdot \overline{P_{i-1}})+(\text{fheight} \overline{A_i} \cdot B_i \cdot Q_{i-1})$$

$$Q_i=(\overline{A_i \cdot B_i} \cdot Q_{i-1})+(A_i \cdot \overline{B_i} \cdot P_{i-1})+(A_i \cdot B_i \cdot \overline{Q_{i-1}})+(\text{fheight} \overline{A_i} \cdot B_i \cdot \overline{P_{i-1}})$$

In this case, the equations of the two-dimensional differential decoder are:

$$A_i=(\overline{P_i \cdot Q_i} \cdot Q_{i-1})+(P_i \cdot \overline{Q_i} \cdot \text{fheight} \overline{P_{i-1}})+(P_i \cdot Q_i \cdot \overline{Q_{i-1}})+(\text{fheight}\overline{P_i} \cdot Q_i \cdot P_{i-1})$$

$$B_i=(\overline{P_i \cdot Q_i} \cdot P_{i-1})+(P_i \cdot \overline{Q_i} \cdot Q_{i-1})+(P_i \cdot Q_i \cdot \overline{P_{i-1}})+(\text{fheight}\overline{P_i} \cdot Q_i \cdot \overline{Q_{i-1}})$$

where P and Q are the bits from the differential coder applied to the input of the differential decoder, A and B are the bits applied to the input of the differential coder from the differential decoder, $\overline{X}$ is the complement of X, $X_{i-1}$, is the bit considered at time t−1 and $X_i$ is the bit considered at time t.

The coder and the decoder are "two-dimensional" in the sense that any bit from the coder is dependent only on the bit preceding it.

The initialization is such that, if $a_0$ is the first message data bit, $a_{-1}$ is forced to "0" to ensure correct differential decoding of $a_0$.

Furthermore, referring to FIG. 2, the multiplexing means 13 can advantageously receive the recovered signal clock HS, also applied to the detector 12, a fixed local clock HL, also applied to the Viterbi decoder 11, and a predictive logic window HP marking the probable appearance of message data symbols. The predictive window HP is provided in all TDMA signal receivers to indicate that a message data burst should be present, given the frequency at which these bursts are transmitted. The position of this window is precisely controlled by the signal DET to command the insertion of the code sequence SC.

Among other things, the predictive window HP is used to control application of the code sequence SC to the Viterbi decoder 11 before the message data appears (i.e. in the absence of detection of the synchronization word). This is particularly beneficial at call set-up time (when there is no antecedent data burst) or when the synchronization word closely precedes the message data.

The multiplexing means 13 preferably comprise a FIFO read by the fixed local clock HL to insert the code sequence SC in a manner that is not sensitive to loss of the recovered clock HS. The writing of the received symbols into this FIFO is timed by the recovered clock HS.

The means 13 advantageously also demultiplex the message data in order to halve the operating frequency of the decoder 11. They can also insert null bits (bits which are ignored in calculating the metrics) if convolutional coding with puncture logic is used, in order to have the decoder 11 operate with a ½ code.

The Viterbi decoder used can be the Qualcomm Q1650 device, for example, and reference may usefully be had to the technical message data sheet on this circuit which describes various aspects of coding and decoding utilized in the invention.

The invention also concerns a digital data receiver including an initialization device as described hereinabove. This receiver can be used to receive data transmitted by satellites, for example.

The invention also concerns a method of initializing a Viterbi decoder in a receiver for signals transmitted in the form of bursts, each burst comprising a synchronization word and message data that has undergone convolutional coding in a transmitter, the position of the message data relative to the synchronization word being known, said method consisting in:
 detecting the synchronization word,
 applying the received signals to the Viterbi decoder in the presence of message data,
 applying to the Viterbi decoder, immediately before and immediately after the message data, a code sequence generated locally, free of errors and having a length at least equal to the truncation length of the Viterbi decoder.

There is claimed:

1. Device for initializing a Viterbi decoder in a receiver for signals transmitted in the form of bursts, each burst comprising a synchronization word and message data that has undergone convolutional coding in a transmitter, the position of said message data relative to said synchronization word being known, said device comprising:
 means for detecting said synchronization word,
 multiplexing means for applying the received signals to said Viterbi decoder in the presence of said message data and for applying to said Viterbi decoder, immediately before and immediately after said message data, a code sequence generated locally, free of errors and having a length at least equal to the truncation length of said Viterbi decoder.

2. Device according to claim 1 wherein said code sequence generated locally is supplied continuously to said Viterbi decoder, except when said message data is present, so that said Viterbi decoder sees only a continuous stream of data to be decoded.

3. Device according to claim 1 wherein said code sequence generated locally is made up of identical logic levels.

4. Device according to claim 1 wherein each of said bursts includes a preamble in which said synchronization word is written.

5. Device according to claim 1 wherein said synchronization word precedes said message data in said bursts.

6. Device according to claim 1 wherein each of said bursts includes a postamble obtained by convolution of the last message data words transmitted with a sequence having a length at least equal to k−1 where k is the constraint length of the convolutional coder used in the transmitter.

7. Device according to claim 6 wherein said sequence having a length at least equal to k−1 is made up of a sequence of logic "0" states.

8. Device according to claim 1 wherein said convolutional coder has a generator polynomial G=(171, 133).

9. Device according to claim 1 wherein said multiplexing means comprises a FIFO read by a fixed local clock to insert said code sequence in a manner that is not sensitive to loss of a recovered clock.

10. A device according to any one of claims 1 through 9 wherein said device is used in a digital message data receiver.

11. A device according to claim 10 wherein said digital message receiver receives data transmitted by satellite.

12. Method of initializing a Viterbi decoder in a receiver for signals transmitted in the form of bursts, each burst comprising a synchronization word and message data that has undergone convolutional coding in a transmitter, the position of said message data relative to said synchronization word being known, said method consisting in:

detecting said synchronization word, applying said received signals to said Viterbi decoder in the presence of said message data, applying to said Viterbi decoder, immediately before and immediately after said message data, a code sequence generated locally, free of errors and having a length at least equal to the truncation length of said Viterbi decoder.

* * * * *